United States Patent
Shiu et al.

(10) Patent No.: US 8,785,956 B2
(45) Date of Patent: Jul. 22, 2014

(54) CHIP PACKAGE HAVING OPTICAL-ELECTRONIC DEVICE WITH PLURALITY OF LIGHT SHIELDING LAYERS AND SUBSTRATE THROUGH-HOLE WITH VOID, AND METHOD FOR FORMING THE SAME

(76) Inventors: Chuan-Jin Shiu, Zhongli (TW);
Po-Shen Lin, New Taipei (TW);
Yi-Ming Chang, Pingzhen (TW);
Hui-Ching Yang, Zhongli (TW);
Chiung-Lin Lai, Taoyuan (TW)

( * ) Notice: Subject to any disclaimer, the term of this patent is extended or adjusted under 35 U.S.C. 154(b) by 48 days.

(21) Appl. No.: 13/560,842

(22) Filed: Jul. 27, 2012

(65) Prior Publication Data
US 2013/0026523 A1     Jan. 31, 2013

Related U.S. Application Data

(60) Provisional application No. 61/513,487, filed on Jul. 29, 2011.

(51) Int. Cl.
| | | |
|---|---|---|
| H01L 33/00 | (2010.01) | |
| H01L 21/00 | (2006.01) | |
| H01L 33/52 | (2010.01) | |
| H01L 27/146 | (2006.01) | |
| H01L 23/00 | (2006.01) | |

(52) U.S. Cl.
CPC .......... *H01L 27/14623* (2013.01); *H01L 33/52* (2013.01); *H01L 27/14618* (2013.01); *H01L 27/1469* (2013.01); *H01L 2224/13024* (2013.01); *H01L 27/14634* (2013.01); *H01L 24/13* (2013.01); *H01L 27/14636* (2013.01); *H01L 27/14687* (2013.01); *H01L 27/14632* (2013.01); *H01L 2224/02372* (2013.01)
USPC ..... 257/98; 257/99; 257/E31.122; 257/E33.072; 438/29; 438/72

(58) Field of Classification Search
USPC .................. 257/435, 437, E21.029, E31.122; 438/29, 69, 72, 697, 781
See application file for complete search history.

(56) References Cited

U.S. PATENT DOCUMENTS

| | | | |
|---|---|---|---|
| 2004/0147051 A1* | 7/2004 | Wada | 438/22 |
| 2009/0096051 A1* | 4/2009 | Sugiyama et al. | 257/435 |
| 2011/0228193 A1* | 9/2011 | Shin et al. | 349/61 |
| 2012/0243099 A1* | 9/2012 | Kaneko | 359/611 |
| 2013/0072615 A1* | 3/2013 | Muro et al. | 524/406 |

FOREIGN PATENT DOCUMENTS

WO    WO 2011145742 A1 * 11/2011

* cited by examiner

*Primary Examiner* — William F Kraig
*Assistant Examiner* — Khaja Ahmad
(74) *Attorney, Agent, or Firm* — Liu & Liu

(57) ABSTRACT

An embodiment of the invention provides a chip package which includes: a substrate having a first surface and a second surface; an optoelectronic device formed in the substrate; a conducting layer disposed on the substrate, wherein the conducting layer is electrically connected to the optoelectronic device; an insulating layer disposed between the substrate and the conducting layer; a first light shielding layer disposed on the second surface of the substrate; and a second light shielding layer disposed on the first light shielding layer and directly contacting with the first light shielding layer, wherein a contact interface is between the first light shielding layer and the second light shielding layer.

20 Claims, 9 Drawing Sheets

US 8,785,956 B2

CHIP PACKAGE HAVING OPTICAL-ELECTRONIC DEVICE WITH PLURALITY OF LIGHT SHIELDING LAYERS AND SUBSTRATE THROUGH-HOLE WITH VOID, AND METHOD FOR FORMING THE SAME

CROSS REFERENCE TO RELATED APPLICATIONS

This Application claims the benefit of U.S. Provisional Application No. 61/513,487, filed on Jul. 29, 2011, the entirety of which is incorporated by reference herein.

BACKGROUND OF THE INVENTION

1. Field of the Invention

The invention relates to a chip package and fabrication method thereof, and in particular relates to an optoelectronic device chip package and fabrication method thereof.

2. Description of the Related Art

Optical-electronic devices such as light sensing devices or light emitting devices play an important role for image capture or lighting applications. These optical-electronic devices are widely used in electronic products such as digital cameras, digital video recorders, mobile phones, solar cells, screens, illumination elements, and so on.

Along with advancements in technological development, requirements for light sensing precision of light sensing devices or light emitting precision of light emitting devices have increased.

BRIEF SUMMARY OF THE INVENTION

An embodiment of the invention provides a chip package which includes: a substrate having a first surface and a second surface; an optoelectronic device formed in the substrate; a conducting layer disposed on the substrate, wherein the conducting layer is electrically connected to the optoelectronic device; an insulating layer disposed between the substrate and the conducting layer; a first light shielding layer disposed on the second surface of the substrate; and a second light shielding layer disposed on the first light shielding layer and directly contacting with the first light shielding layer, wherein a contact interface is between the first light shielding layer and the second light shielding layer.

An embodiment of the invention provides a method for forming a chip package which includes: providing a substrate having a first surface and a second surface, wherein at least one optoelectronic device is formed in the substrate; forming an insulating layer on the substrate; forming a conducting layer on the insulating layer on the substrate, wherein the conducting layer is electrically connected to the at least one optoelectronic device; forming a first light shielding layer on the second surface of the substrate; and forming a second light shielding layer on the first light shielding layer, wherein the second light shielding layer directly contacts with the first light shielding layer, and a contact interface is between the first light shielding layer and the second light shielding layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
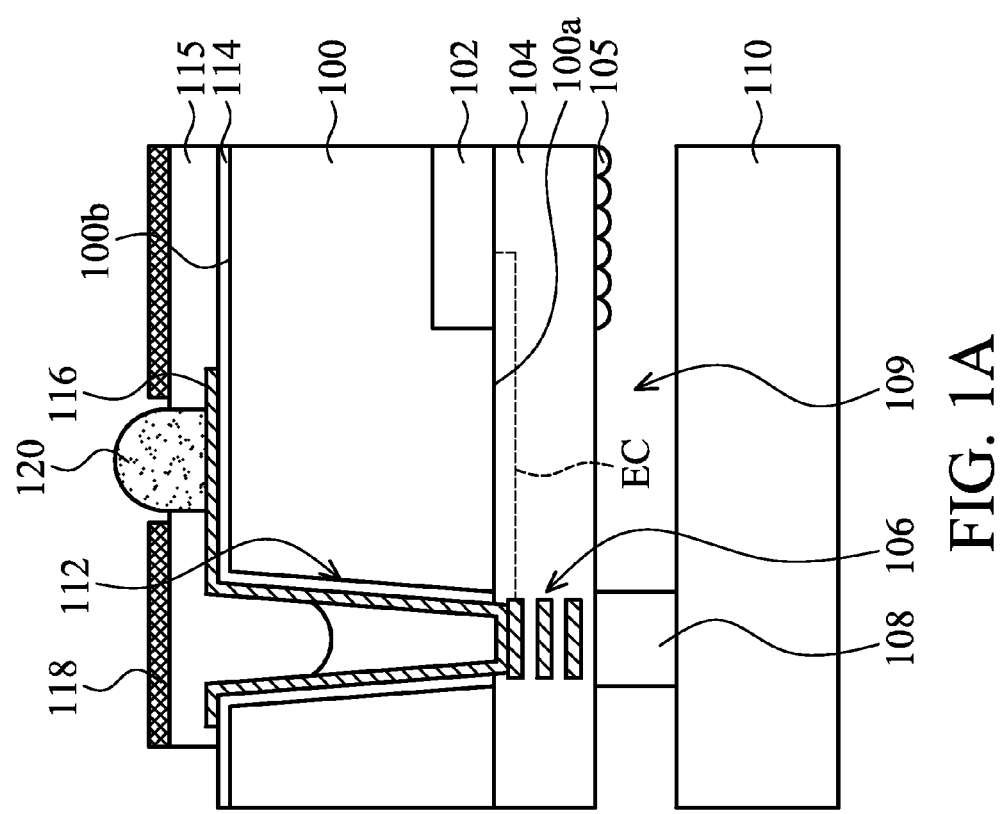
FIGS. 1A and 1B are a cross-sectional view and an enlarged view, respectively, showing a chip package known by the inventor.

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package an optoelectronic device such as light sensing devices or light emitting devices. However, embodiments of the invention are not limited thereto. For example, the chip package of the embodiments of the invention may be applied to active or passive devices, or electronic components with digital or analog circuits, such as optoelectronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power ICs.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, the diced package is a chip scale package (CSP). The size of the chip scale package (CSP) may only be slightly larger than the size of the packaged chip. For example, the size of the chip package is not larger than 120% of the size of the packaged chip.

Figure 1B:
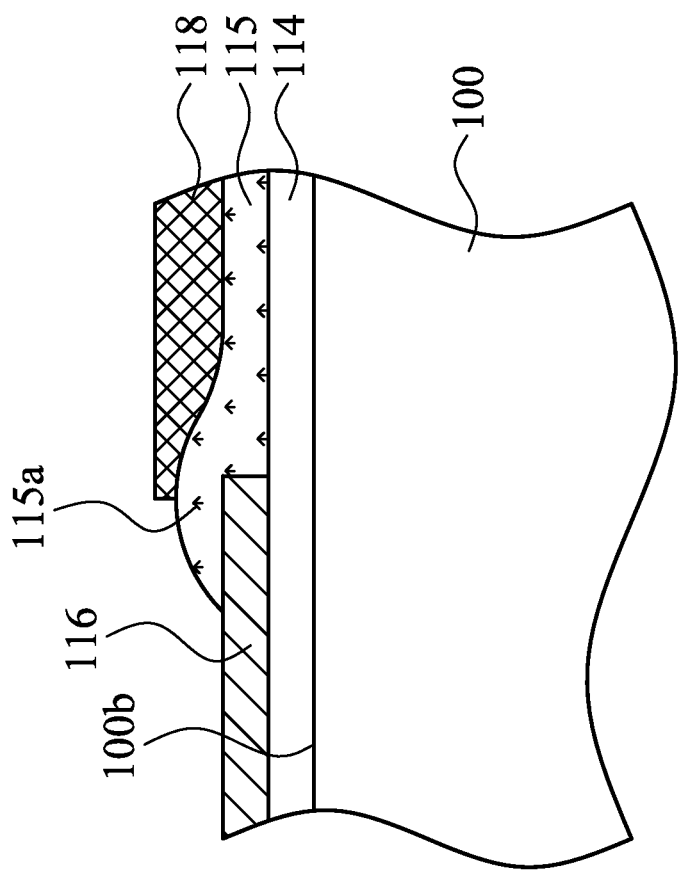

FIGS. 1A and 1B are a cross-sectional view and an enlarged view, respectively, showing a chip package known by the inventor. It should be appreciated that the chip package shown in FIGS. 1A and 1B is merely used to illustrate problems found by the inventor of the application, which is not a commonly known prior art for one skilled in the art.

As shown in FIG. 1A, the chip package may include a substrate 100. An optoelectronic device 102 is formed in the substrate 100. The optoelectronic device 102 may be electrically connected to a conducting pad structure disposed on a surface 100a of the substrate 100 through a wire layer (depicted by broken line EC). The conducting pad structure 106 is disposed in, for example, an insulating layer 104 on the surface 100a of the substrate 100. A substrate 110 may also be disposed on the surface 100a of the substrate 100. The substrate 110 and the substrate 100 may be separated from each other by a spacer layer 108. The spacer layer 108, the substrate 100, and the substrate 110 may together surround a cavity 109 on the optoelectronic device 102. A lens 105 may be disposed in the cavity 109 on the optoelectronic device 102. A through-hole 112 may be formed in the substrate 100 which extends from a surface 100b towards the surface 100a, wherein the through-hole 112 may expose the conducting pad structure 106. An insulating layer 114 and a conducting layer 106 may be formed on a sidewall of the through-hole 112. The insulating layer 114 and the conducting layer 116 may extend onto the surface 100b of the substrate 100. A protection layer 115 and a conducting bump 120 may be disposed on the surface 100b of the substrate 100. The protection layer 115 may be a solder resist layer such as green paint. The conducting bump 120 may be electrically connected to the conducting pad structure 106 through the conducting layer 116. A light shielding layer 118 may be disposed on the protection layer 115 to prevent outside light from entering the substrate 100 to negatively affect the operation of the optoelectronic device 102.

However, the light shielding layer 118 formed on the protection layer 115 may be negatively affected by the protection layer 115 thereunder such that cracks or voids are formed. The existence of the cracks or voids may result in outside light penetrating the light shielding layer 118 to enter the substrate 100 and negatively affect the operation of the optoelectronic device 102.

FIG. 1B is an enlarged view partially showing the chip package in FIG. 1A. Because the protection layer 115 usually has high stress, cracks are easily generated such that cracks are also easily formed in the light shielding layer 118 thereon. Further, as shown in FIG. 1B, because the light shielding layer 118 formed on the conducting layer 116 is usually blanketly formed on the protection layer 115, due to the influence of the profile of the material layer thereunder, the light shielding layer 118 located on the conducting layer 116 has a smaller thickness. Thus, cracks or voids are more easily formed. In addition, fillers 115a are often filled in the protection layer 115. The filler 115a may cause the light shielding layer 118 to break more easily, which leads to leakage of light, especially the portion of the light shielding layer 118 having a thinner thickness. In order to resolve the problem of light leaking to the light shielding layer 118, the embodiments of the invention provide a novel chip package and the fabrication method thereof, which are described in the following.

Figure 2A:
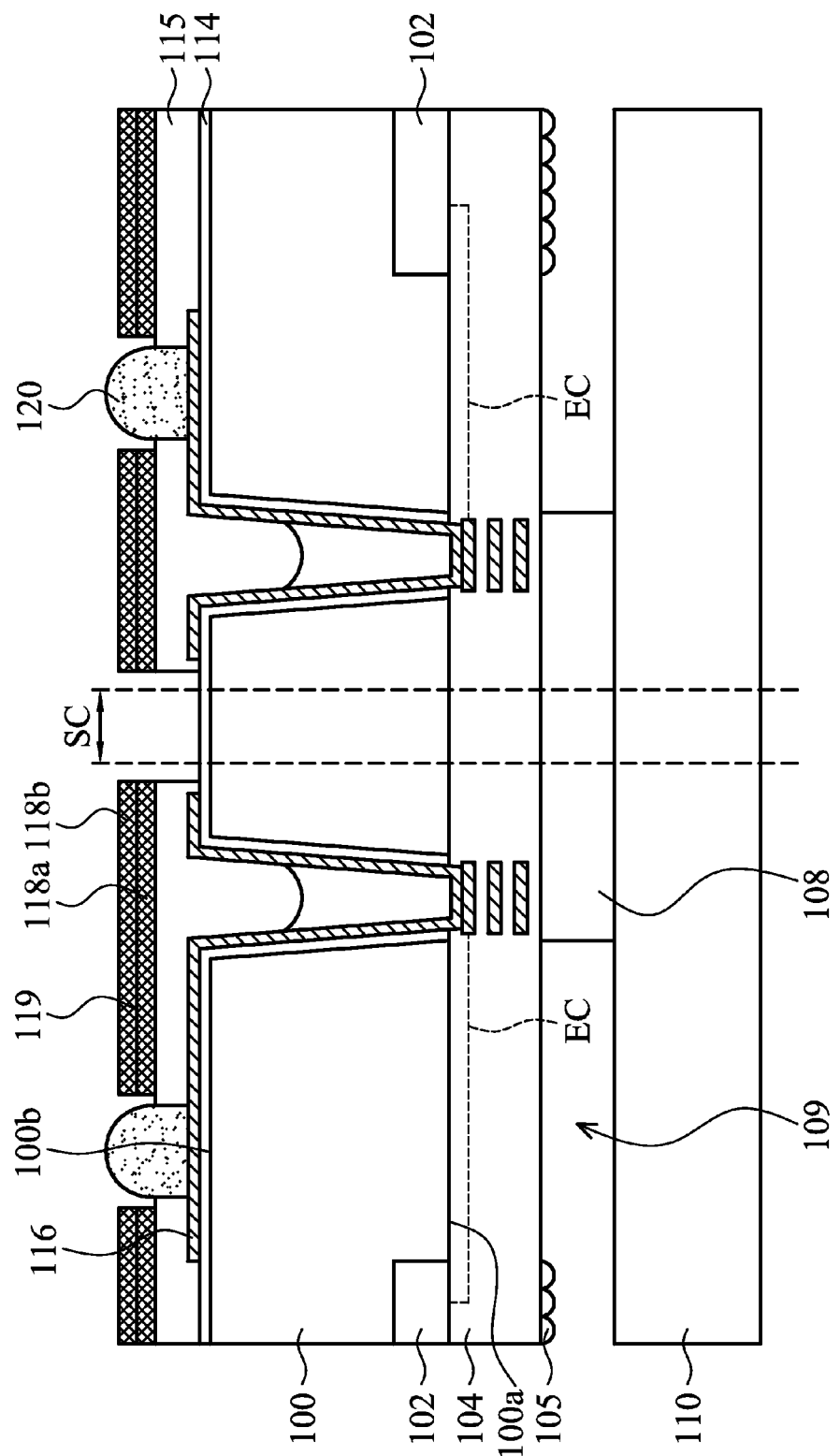
FIGS. 2A-2B are cross-sectional views showing the steps of forming a chip package according to an embodiment of the present invention.
Figure 2B:
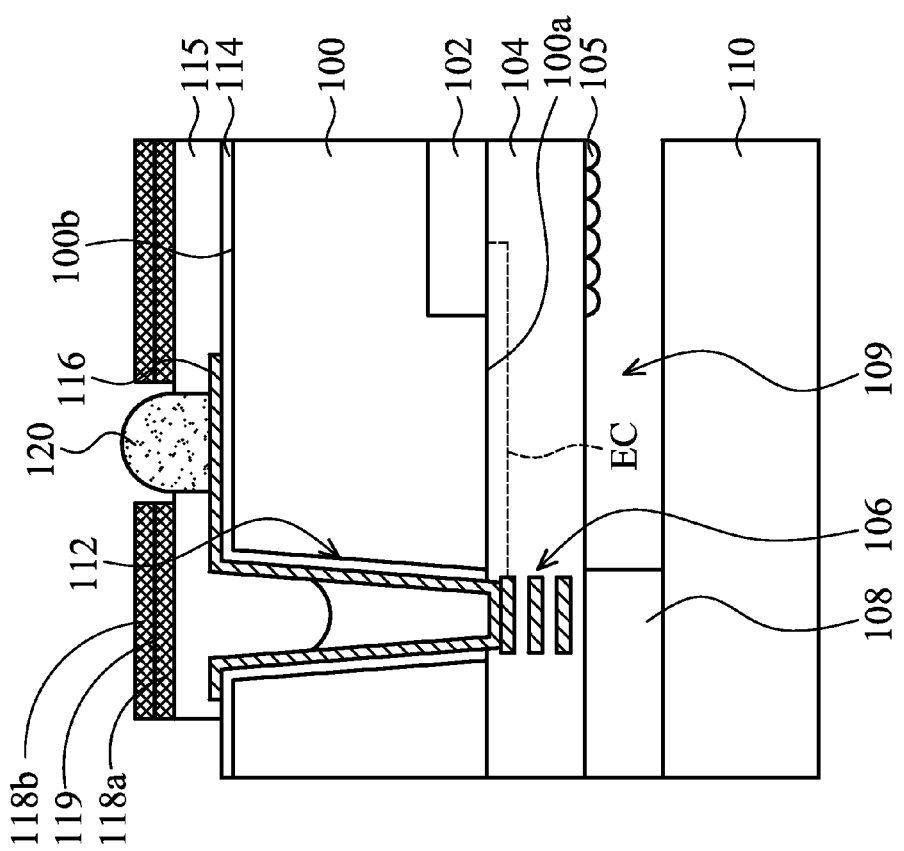

FIGS. 2A-2B are cross-sectional views showing the steps of forming a chip package according to an embodiment of the present invention, wherein same or similar reference numbers are used to designate same or similar elements. The chip package according to the embodiment of the invention may be formed by using, for example, (but is not limited to) a wafer-level packaging process to reduce fabrication cost and time and ensure packaging quality.

In one embodiment, the process steps of a chip package include a front-end chip (wafer) process step and a back-end package process step. Through front-end semiconductor processes such as deposition, etching, and development, a variety of integrated circuits may be formed on a wafer. Then, a back-end wafer-level packaging process may be performed to the wafer having integrated circuits formed thereon, followed by a dicing process step to form a plurality of separate chip scale packages.

As shown in FIG. 2A, in the front-end chip process step, a substrate 100 is first provided, which is, for example, a semiconductor substrate. In one embodiment, the substrate 100 includes a semiconductor material, which is, for example, a semiconductor wafer (such as a silicon wafer). A wafer-level packaging process may be performed to the substrate 100 to reduce the fabrication time and cost. The substrate 100 has surfaces 100a and 100b. The surfaces 100a and 100b are, for example, opposite to each other. The substrate 100 may have a plurality of predetermined scribe lines SC which define the substrate 100 into a plurality of (die) regions. After a packaging process and a dicing process are subsequently performed, each of the regions is packaged in a chip package.

As shown in FIG. 2A, in one embodiment, optoelectronic devices 102 are formed in the substrate 100. The optoelectronic device 102 may include (but is not limited to) an image sensor device or a light emitting device. The image sensor device is, for example, a CMOS image sensor (CIS) device or a charge-coupled sensing device (CCD), and the light emitting device is, for example, a light emitting diode device. The optoelectronic device 102 may be electrically connected to, for example, a conducting pad structure 106 in an insulating layer 104 formed on the surface 100a (via electrical connection EC depicted by broken line EC; also shown in FIGS. 3 and 4) and may be connected to another conducting route through the conducting pad structure 106. The conducting pad structure 106 may be a plurality of conducting pads stacked with each other, a single conducting pad, or a conducting pad structure constructed by at least a conducting pad and at least an interconnection structure.

After the front-end chip process step is finished, the back-end package process step may be subsequently performed. In one embodiment, an optical auxiliary device such as a lens may be disposed on the optoelectronic device 102. For example, the lens 105 may be disposed on the insulating layer 104 to substantially align with the optoelectronic device 102. The lens 105 may be used to assist in the entering and/or exiting of light. The lens 105 may be, for example, a micro-lens array. In one embodiment, a color filter plate (not shown) may be optionally disposed on the lens 105. The color filter plate may be disposed, for example, between the lens 105 and the optoelectronic device 102.

Then, a substrate 110 may be optionally disposed on the surface 100a of the substrate 100. The substrate 110 is, for example, a transparent substrate such as a glass substrate, quartz substrate, transparent polymer substrate, or combinations thereof. In one embodiment, the size and the shape of the substrate 110 may be similar to those of the substrate 100.

In one embodiment, the substrate 100 and the substrate 110 may be optionally separated from each other by a spacer layer 108. The spacer layer 108 may be formed in advance on the substrate 110 or the substrate 100. The spacer layer 108 may be, for example, an insulating material such as a polymer material, ceramic material, or combinations thereof. In one embodiment, the spacer layer 108, the substrate 100, and the substrate 110 may together surround a cavity 109 on the optoelectronic device 102. The lens 105 may be located in the cavity 109 without contacting with the substrate 110.

Then, the substrate 100 may be optionally thinned to facilitate subsequent process steps. For example, the substrate 110 may be used as a support, and a thinning process may be performed from the surface 100b of the substrate 100 to thin down the substrate 100 to an appropriate thickness. The thinning process may be, for example, a mechanical grinding process, chemical mechanical polishing process, etching process, or combinations thereof.

In one embodiment, a conducting layer electrically connected to the conducting pad structure 106 may then be formed on the substrate 100. In one embodiment, a through substrate conducting structure electrically connected to the conducting pad structure 106 may be formed in the substrate 100. For example, by using a photolithography process and an etching process, a portion of the substrate 100 may be removed from the surface 100b of the substrate 100 to form a through-hole 112 extending towards the conducting pad structure 106. Then, an insulating layer 114 may be formed on the surface 100b of the substrate 100. The insulating layer 114 may be, for example, silicon oxide, silicon nitride, silicon oxynitride, polymer material, or combinations thereof. The insulating layer 114 may be formed by using, for example, a vapor deposition process, applying process, or thermal oxidation process. The insulating layer 114 may extend into the through-hole 112 to be located on the sidewall and the bottom of the through-hole 112. Then, by using a photolithography process and an etching process, the insulating layer 114 at the bottom of the through-hole 112 and the insulating layer 104 thereunder may be removed such that a portion of the conducting pad structure 106 is exposed.

Then, a conducting layer 116 is formed on the surface 100b of the substrate 100. The conducting layer 116 may extend into the through-hole 112 to electrically contact with the conducting pad structure 106 exposed by the through-hole 112. The material of the conducting layer 116 is, for example, (but is not limited to) a metal material such as copper, aluminum, gold, nickel, tungsten, or combinations thereof. The conducting layer 116 may be formed by using, for example, a physical vapor deposition process, chemical vapor deposition process, electroplating process, electroless plating process, or combinations thereof. In one embodiment, the conducting layer 116 may be patterned according to requirements through a photolithography process and an etching process.

Then, a protection layer 115 may be formed on the conducting layer 116. The protection layer 115 may be a solder resist material such as green paint. In one embodiment, the protection layer 115 may be patterned through an exposure process and a development process to form openings exposing the conducting layer 116. In one embodiment, the protection layer 115 may be planarized to facilitate subsequent process steps. For example, the protection layer 115 may be planarized through a mechanical grinding process or a chemical mechanical polishing process.

As shown in FIG. 2A, after the conducting layer 116 is formed, a light shielding layer 118a is formed on the surface 100b and the conducting layer 116. In one embodiment, a solution (such as a polymer solution) used for forming the light shielding layer 118 may be applied on the surface 100b of the substrate 100 to form a light shielding material layer. Then, the light shielding material layer may be patterned according to requirements to form the light shielding layer 118a. For example, the light shielding material layer may be a material layer capable of being patterned, such as a photoresist layer (ex. a black photoresist layer). Thus, an exposure process and a development process may be performed to the light shielding material layer to form the light shielding layer 118a having a desired pattern. In one embodiment, the light shielding layer 118a may be a negative type photoresist layer. In one embodiment, the light shielding layer 118a may have at least an opening exposing the conducting layer 116. In one embodiment, the light shielding layer 118a may have a light shielding rate of more than about 80%. For example, the light shielding rate of the light shielding layer 118a may range from between 80% and 99.9%, 85% and 99.5%, or 90% and 99%. Usually, the light shielding rate of the light shielding layer 118a determines the light shielding degree of the visible light and/or the IR light. However, in another application, the light shielding rate of the light shielding layer 118a may indicate the light shielding degree of the UV light, the X-ray, or another radiation light having a shorter wavelength.

The light shielding layer 118a may assist in blocking and/or absorbing light coming from the outside of the chip package, especially light coming from behind the surface 100b of the substrate 100, thus facilitating operation of the optoelectronic device 102. For example, if the optoelectronic device 102 is an image sensor device, the light shielding layer 118 may block and/or absorb light coming from the surface 100b of the substrate 100 to prevent image noise from occurring. Alternatively, if the optoelectronic device 102 is a light emitting device, the light shielding layer 118 may block and/or absorb light coming from the surface 100b of the substrate 100 to prevent the wavelength and/or the intensity of light emitted by the chip package from being affected by external light.

However, the single-layered light shielding layer 118a may be negatively affected by the protection layer 115 thereunder such that cracks, defects, and/or voids are formed in the light shielding layer 118a. As shown in FIG. 1B, the light shielding layer may have a portion with a thinner thickness, and the portion having the thinner thickness is easily affected by the protection layer thereunder to have cracks, defects, and/or voids. Thus, the single-layered light shielding layer 118a can not effectively block and/or absorb light coming from the outside of the chip package.

In order to resolve the problems mentioned above, in one embodiment, a light shielding layer 118b may be further formed on the light shielding layer 118a. The light shielding layer 118b may directly contact with the light shielding layer 118a, and a contact interface is between the light shielding layer 118a and the light shielding layer 118b. In another embodiment, other light shielding layers may be formed on the light shielding layer 118b. The light shielding layer 118a and the light shielding layer 118b may together block and/or absorb light coming from the outside of the chip package to ensure that the optoelectronic device 102 is operating well. In one embodiment, the material of the light shielding layer 118a and the material of the light shielding layer 118b may be the same. In another embodiment, the material of the light shielding layer 118a may be different from the material of the light shielding layer 118b.

In one embodiment, a solution (such as a polymer solution) used for forming the light shielding layer 118b may be applied on the light shielding layer 118a to form a light shielding material layer. Then, the light shielding material layer may be patterned according to requirements to form the light shielding layer 118b. For example, the light shielding material layer may be a material layer capable of being patterned, such as a photoresist layer (ex. a black photoresist layer). Thus, an exposure process and a development process may be performed to the light shielding material layer to form the light shielding layer 118b having a desired pattern.

In one embodiment, if the solution (such as a polymer solution) used for forming the light shielding layer 118b is applied on the light shielding layer 118a to form the light shielding material layer, defects may be generated to negatively affect the operation of the optoelectronic device 102. In order to prevent the defects mentioned above from occurring, in one embodiment, the light shielding layer 118a may be hardened before the light shielding layer 118b is formed. In one embodiment, the light shielding layer 118a may be hardened through a heating process, irradiation process, or chemical reaction process. For example, in one embodiment, a heating process may be performed to the light shielding layer 118a to harden the light shielding layer 118a. For example, the temperature of the light shielding layer 118a may be elevated to about 150° C. to about 250° C. and be maintained for about 15 minutes to about 1 hour. In one embodiment, the heating process is disposing the light shielding layer 118a in an oven to bake at about 200° C. for about 30 minutes.

In one embodiment, the solution (such as a polymer solution) used for forming the light shielding layer 118b may be applied on the hardened light shielding layer 118a to form a light shielding material layer. Then, the light shielding material layer may be patterned according to requirements to form the light shielding layer 118b. In this case, it is not easy for a defect to be generated in the formed light shielding layer 118a and the light shielding layer 118b, facilitating the operation of the optoelectronic device 102. It is possible that after the light shielding layer 118a is hardened, it is not easy for the light shielding layer 118a to be dissolved by the solution used for forming the light shielding layer 118b. Thus, the probability of defects being generated may be reduced. In one embodiment, a hardening process, such as a heating process, may also be performed to the light shielding layer 118b. It should be appreciated that the temperature and curing time of the heating process need to be sufficient to effectively increase the overall thickness of the light shielding layers and reduce the generation of defects.

Then, a conducting bump 120 may be disposed in the opening of the protection layer 115. In one embodiment, an under bump metallurgy layer (not shown) may be disposed between the conducting bump 120 and the conducting layer 116. In one embodiment, a solder material may be filled in the opening of the protection layer 115. Then, a reflow process may be performed to the solder material to form the conducting bump 120.

Next, a dicing process may be performed along the predetermined scribe lines SC to form a plurality of chip packages separated from each other, as shown in FIG. 2B. In the chip package, the overall thickness of the light shielding layers 118a and 118b is thicker, which provides better light shielding to improve the operation and the reliability of the chip package.

Figure 3A:
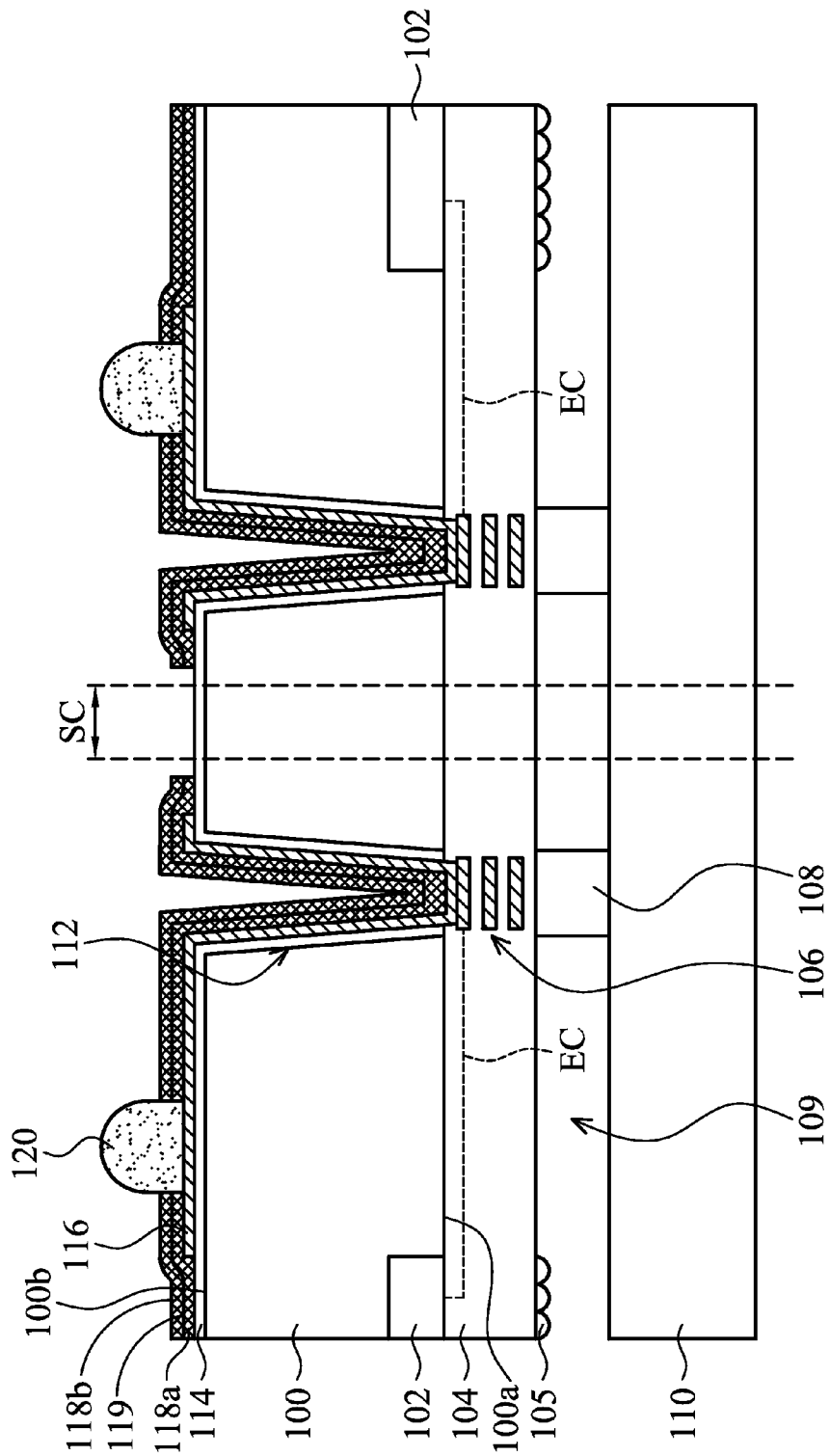
FIGS. 3A-3B are cross-sectional views showing the steps of forming a chip package according to an embodiment of the present invention.
Figure 3B:
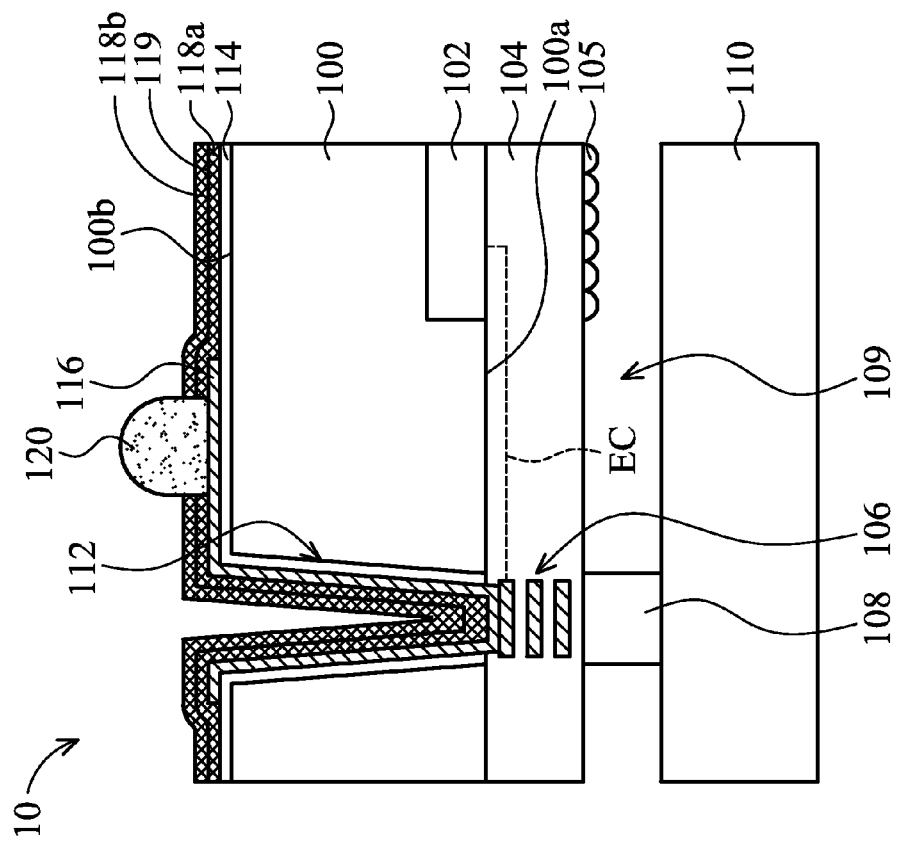

FIGS. 3A-3B are cross-sectional views showing the steps of forming a chip package according to another embodiment of the present invention, wherein same or similar reference numbers are used to designate same or similar elements.

As shown in FIG. 3A, a plurality of light shielding layers which include, for example, the light shielding layer 118a and the light shielding layer 118b may be formed on the surface 100b of the substrate 100 by using a method similar to that described in the embodiment shown in FIG. 2. The light shielding layer 118a and the light shielding layer 118b may directly contact with each other and have the contact interface 119 formed therebetween. In this embodiment, a solder resist layer may not be formed between the substrate 100 and the light shielding layer 118a. In this case, the light shielding layer 118a and the light shielding layer 118b may also serve as a solder resist layer. In one embodiment, a solder material may be filled in the opening of the light shielding layer 118a and the light shielding layer 118b which exposes the conducting layer 116, and the conducting bump 120 may be formed through a reflow process. In this case, the conducting bump 120 may directly contact with the light shielding layer 118a and/or the light shielding layer 118b. Then, a dicing process similar to that described in the embodiment shown in FIG. 2 may be performed along the predetermined scribe lines SC to form a plurality of chip packages 10 separated from each other, as shown in FIG. 3B.

In the chip package shown in FIG. 3B, the overall thickness of the light shielding layer 118a and the light shielding layer 118b is thicker, which may provide better light shielding to improve the operation and the reliability of the chip package. In addition, there is no protection layer (such as a solder resist layer) under the light shielding layer. Thus, defects in the light shielding layers 118a and 118b are further reduced, facilitating the operation of the optoelectronic device 102. In the embodiment shown in FIG. 3B, the light shielding layer 118a may directly contact with the conducting layer 116 and may be substantially conformally located on the conducting layer 116 on the sidewall of the through-hole 112. However, embodiments of the invention are not limited thereto and may have many variations. For example, FIGS. 4A-4C are cross-sectional views showing chip packages according to other embodiments of the present invention, wherein same or similar reference numbers are used to designate same or similar elements.

Figure 4A:
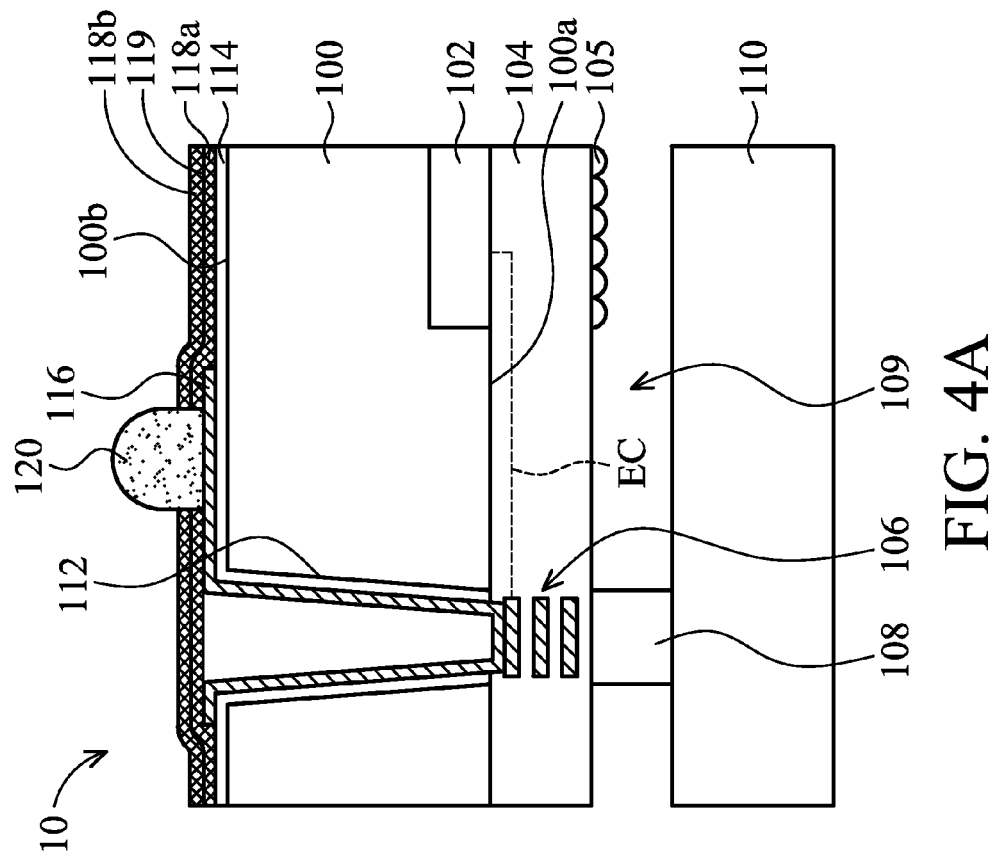
FIGS. 4A-4C are cross-sectional views showing chip packages according to embodiments of the present invention.
Figure 4B:
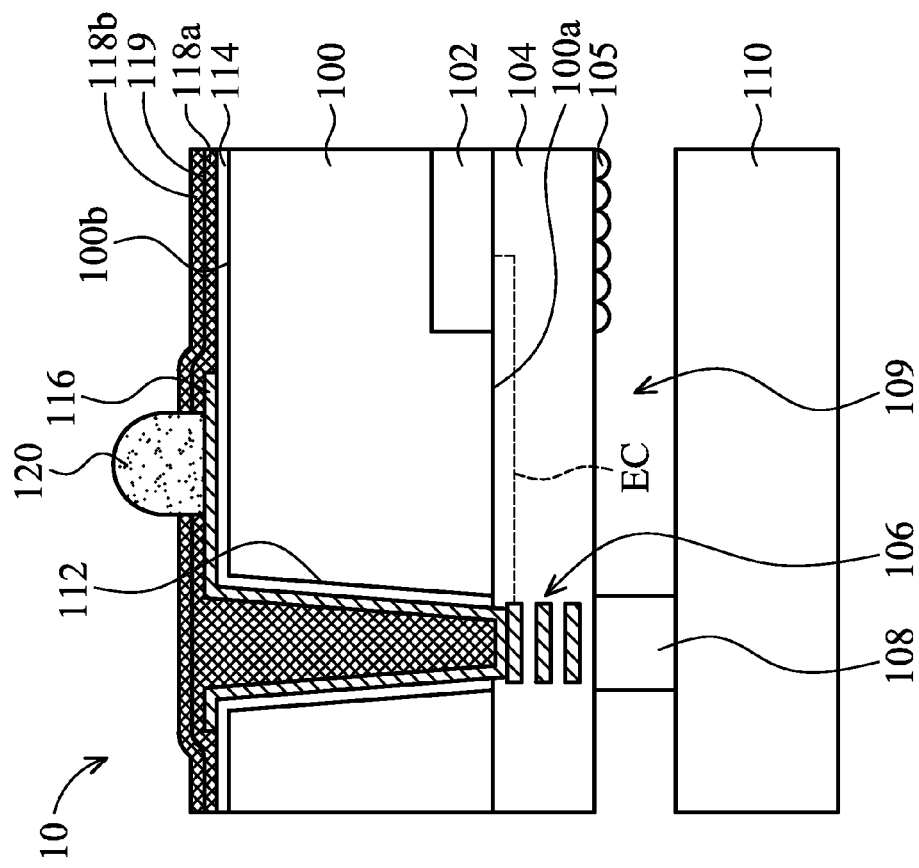
Figure 4C:
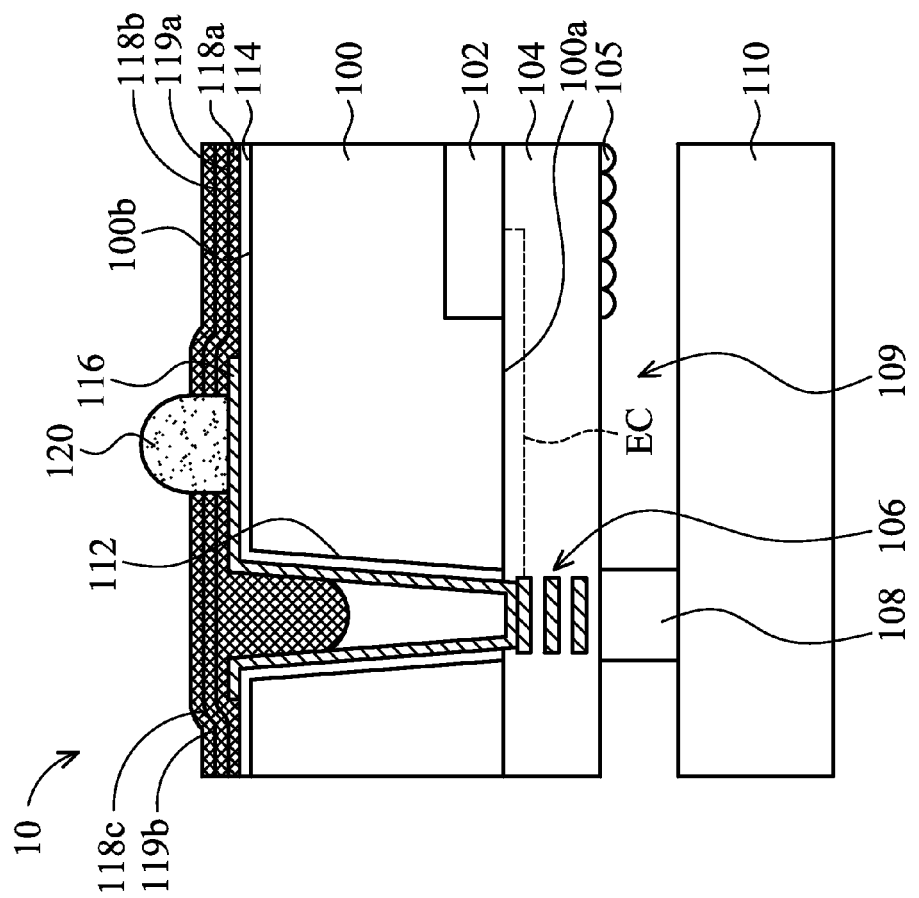

As shown in FIG. 4A, in one embodiment, the light shielding layer 118a and the light shielding layer 118b may only cover the through-hole 112 and substantially does not fill the through-hole 112. In another embodiment, the light shielding layer 118a may fill the through-hole 112. For example, in the embodiment in FIG. 4B, the light shielding layer 118a may completely fill the through-hole 112. Alternatively, as shown in FIG. 4C, in one embodiment, the light shielding layer 118a may partially fill the through-hole 112 and a space is left. In addition, in the embodiment shown in FIG. 4C, a light shielding layer 118c may be formed on the light shielding layer 118b by using a similar method used for forming the light shielding layer 118b, wherein a contact interface 119a is between the light shielding layer 118a and the light shielding layer 118b, and a contact interface 119b is between the light shielding layer 118b and the light shielding layer 118c.

In the chip package of the embodiments of the invention, the light shielding layer is used to block and/or absorb external light such that operation of the chip package is better. In the chip package of the embodiments of the invention, there are a plurality of light shielding layers directly contacting with each other such that the overall thickness of the light shielding layers is increased. In one embodiment, a hardening process (such as a heating process) may be performed to the light shielding layer in advance, and then another light shielding layer is stacked thereon. Thus, defects in the light shielding layers may be reduced to ensure that the chip package is operating well.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a substrate having a first surface and a second surface;
   an optoelectronic device formed in the substrate;
   a through-hole extending from the second surface to the first surface;
   a conducting layer disposed on the substrate, having a portion overlying both sidewalls and a bottom of the through-hole, wherein the conducting layer is electrically connected to the optoelectronic device;
   an insulating layer disposed between the substrate and the conducting layer;
   a first light shielding layer disposed on the second surface of the substrate; and
   a second light shielding layer disposed on the first light shielding layer and directly contacting with the first light shielding layer, wherein a contact interface is between the first light shielding layer and the second light shielding layer,
   wherein the through-hole is partially filled with the first light shielding layer such that a void is formed between the bottom of the through-hole and the first light shielding layer in the through-hole, and wherein the portion of the conducting layer, which overlies both sidewalls and the bottom of the through-hole, directly contacts the void.

2. The chip package as claimed in claim 1, further comprising a conducting bump disposed on the second surface of the substrate and electrically contacting with the conducting layer.

3. The chip package as claimed in claim 1, further comprising a protection layer disposed between the second surface of the substrate and the first light shielding layer.

4. The chip package as claimed in claim 3, further comprising a conducting bump disposed on the second surface of the substrate and penetrating through the protection layer to electrically contact with the conducting layer.

5. The chip package as claimed in claim 1, further comprising a through-hole extending from the second surface towards the first surface, wherein the insulating layer extends on a sidewall of the through-hole and extends on the second surface of the substrate, and the conducting layer extends on the insulating layer in the through-hole.

6. The chip package as claimed in claim 1, further comprising a transparent substrate disposed on the first surface of the substrate.

7. The chip package as claimed in claim 6, further comprising a spacer layer disposed between the substrate and the transparent substrate, wherein the spacer layer, the substrate, and the transparent substrate together surround a cavity on the optoelectronic device.

8. The chip package as claimed in claim 1, wherein the material of the first light shielding layer and the material of the second light shielding layer are the same.

9. The chip package as claimed in claim 1, further comprising at least one third light shielding layer disposed on the second light shielding layer.

10. The chip package as claimed in claim 9, wherein the at least one third light shielding layer directly contacts with the second light shielding layer.

11. A method for forming a chip package, comprising:
    providing a substrate having a first surface and a second surface, wherein at least one optoelectronic device is formed in the substrate;
    forming a through-hole in the substrate;
    forming an insulating layer on the substrate;
    forming a conducting layer on the insulating layer on the substrate, having a portion overlying both sidewalls and a bottom of the through-hole, wherein the conducting layer is electrically connected to the at least one optoelectronic device;
    forming a first light shielding layer on the second surface of the substrate and partially filling the through-hole with the first light shielding layer such that a void is formed between the bottom of the through-hole and the first light shielding layer in the through-hole; and
    forming a second light shielding layer on the first light shielding layer, wherein the second light shielding layer directly contacts with the first light shielding layer, and a contact interface is between the first light shielding layer and the second light shielding layer, and wherein the portion of the conducting layer, which overlies both sidewalls and the bottom of the through-hole, directly contacts the void.

12. The method for forming a chip package as claimed in claim 11, wherein the step of forming the first light shielding layer comprises:
    applying a polymer solution on the second surface of the substrate to form a light shielding material layer; and
    performing an exposure process and a development process to the light shielding material layer to form the first light shielding layer.

13. The method for forming a chip package as claimed in claim 12, further comprising hardening the first light shielding layer before the second light shielding layer is formed.

14. The method for forming a chip package as claimed in claim 13, wherein the step of hardening the first light shielding layer comprises performing a heating process to the first light shielding layer.

15. The method for forming a chip package as claimed in claim 14, wherein the heating process comprises elevating the temperature of the first light shielding layer to be between about 150° C. and 250° C. and then maintaining the temperature for about 15 minutes and about 1 hour.

16. The method for forming a chip package as claimed in claim 14, wherein the step of forming the second light shielding layer comprises:
    applying a second polymer solution on the first light shielding layer after hardening to form a second light shielding material layer; and
    performing an exposure process and a development process to the second light shielding material layer to form the second light shielding layer.

17. The method for forming a chip package as claimed in claim 16, further comprising hardening the second light shielding layer, wherein the step of hardening the second light shielding layer comprises performing a heating process to the second light shielding layer.

18. The method for forming a chip package as claimed in claim 11, further comprising forming a third light shielding layer on the second light shielding layer.

19. The method for forming a chip package as claimed in claim 11, further comprising:
    forming a protection layer between the substrate and the light shielding layer; and
    planarizing the protection layer before the first light shielding layer is formed.

20. The method for forming a chip package as claimed in claim 11, further comprising performing a dicing process along a plurality of predetermined scribe lines of the substrate to form a plurality of chip packages separated from each other.

* * * * *